(12) United States Patent
Sugizaki (10) Patent No.: US 11,139,325 B2
(45) Date of Patent: Oct. 5, 2021

(54) SOLID-STATE IMAGING DEVICE, IMAGING APPARATUS, AND ELECTRONIC APPARATUS

(71) Applicant: Sony Corporation, Tokyo (JP)

(72) Inventor: Taro Sugizaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/806,172

(22) Filed: Mar. 2, 2020

(65) Prior Publication Data

US 2020/0203410 A1     Jun. 25, 2020

Related U.S. Application Data

(63) Continuation of application No. 16/396,420, filed on Apr. 26, 2019, now Pat. No. 10,615,203, which is a continuation of application No. 15/506,462, filed as application No. PCT/JP2015/073466 on Aug. 21, 2015, now Pat. No. 10,319,761.

(30) Foreign Application Priority Data

Sep. 3, 2014   (JP) .............................. JP2014-179555

(51) Int. Cl.
*H01L 31/0232*     (2014.01)
*H01L 27/14*       (2006.01)
(Continued)

(52) U.S. Cl.
CPC .............. *H01L 27/14* (2013.01); *G02B 5/201* (2013.01); *H01L 27/14621* (2013.01);
(Continued)

(58) Field of Classification Search
CPC .. H04N 9/04559; H04N 9/07; H04N 9/04555; H04N 9/045; G02B 5/201;
(Continued)

(56) References Cited

U.S. PATENT DOCUMENTS 8,736,731 B2    5/2014  Noudo
10,319,761 B2   6/2019  Sugizaki
(Continued)

FOREIGN PATENT DOCUMENTS

CN    101339917 A    1/2009
CN    101682700 A    3/2010
(Continued)

OTHER PUBLICATIONS

U.S. Appl. No. 15/506,462, filed Feb. 24, 2017, Sugizaki.
(Continued)

*Primary Examiner* — Robert G Bachner
(74) *Attorney, Agent, or Firm* — Wolf, Greenfield & Sacks, P.C.

(57) ABSTRACT

The present technology relates to a solid-state imaging device, an imaging apparatus, and an electronic apparatus, which can suppress a color mixture without lowering the sensitivity.
In pixels (red pixels (R pixels), green pixels (G pixels), and blue pixels (B pixels)) other than W pixels and adjacent to the W pixels, light shielding films thicker than those of the W pixels are formed at positions adjacent to the W pixels. Furthermore, the shorter the wavelength, the thicker the light shielding film in the RGB pixels other than the W pixels. The present technology is applicable to the solid-state imaging device.

20 Claims, 8 Drawing Sheets

(51) Int. Cl.
*G02B 5/20* (2006.01)
*H04N 9/04* (2006.01)
*H04N 9/07* (2006.01)
*H01L 27/146* (2006.01)

(52) U.S. Cl.
CPC .. *H01L 27/14623* (2013.01); *H01L 27/14645* (2013.01); *H04N 9/04559* (2018.08); *H04N 9/07* (2013.01); *H04N 9/045* (2013.01); *H04N 9/04555* (2018.08)

(58) Field of Classification Search
CPC ......... H01L 27/14621; H01L 27/14623; H01L 27/14645; H01L 27/14
See application file for complete search history.

(56) References Cited

U.S. PATENT DOCUMENTS

| | | |
|---|---|---|
| 2007/0257998 A1 | 11/2007 | Inoue |
| 2012/0242874 A1 | 9/2012 | Noudo |
| 2013/0242149 A1 | 9/2013 | Terai et al. |
| 2018/0247964 A1 | 8/2018 | Sugizaki |
| 2019/0252438 A1 | 8/2019 | Sugizaki |

FOREIGN PATENT DOCUMENTS

| | | |
|---|---|---|
| CN | 102693991 A | 9/2012 |
| JP | 2009-080313 A | 4/2009 |
| JP | 2012-204449 A | 10/2012 |
| WO | WO 2006/064564 A1 | 6/2006 |
| WO | WO 2012/073402 A1 | 6/2012 |

OTHER PUBLICATIONS

U.S. Appl. No. 16/396,420, filed Apr. 26, 2019, Sugizaki.
International Search Report and Written Opinion and English translation thereof dated Oct. 6, 2015 in connection with International Application No. PCT/JP2015/073466.
International Preliminary Report on Patentability and English translation thereof dated Mar. 16, 2017 in connection with International Application No. PCT/JP2015/073466.
Chinese Office Action dated Nov. 26, 2019 in connection with Chinese Application No. 201580045391.1 and English translation thereof.

SOLID-STATE IMAGING DEVICE, IMAGING APPARATUS, AND ELECTRONIC APPARATUS

CROSS-REFERENCE TO RELATED APPLICATIONS

This application is a continuation of and claims the benefit under 35 U.S.C. § 120 of U.S. patent application Ser. No. 16/396,420, titled "SOLID-STATE IMAGING DEVICE, IMAGING APPARATUS, AND ELECTRONIC APPARATUS," filed Apr. 26, 2019, now U.S. Pat. No. 10,615,203, which is a continuation of U.S. patent application Ser. No. 15/506,462, titled "SOLID-STATE IMAGING DEVICE, IMAGING APPARATUS, AND ELECTRONIC APPARATUS," filed Feb. 24, 2017, now U.S. Pat. No. 10,319,761, which is a National Stage of International Application No. PCT/JP2015/073466, filed in the Japanese Patent Office as a Receiving office on Aug. 21, 2015, which claims priority to Japanese Patent Application Number 2014-179555, filed in the Japanese Patent Office on Sep. 3, 2014, each of which is hereby incorporated by reference in its entirety.

TECHNICAL FIELD

The present technology relates to a solid-state imaging device, an imaging apparatus, and an electronic apparatus. Particularly, the present technology relates to a solid-state imaging device, an imaging apparatus, and an electronic apparatus, which can reduce a color mixture caused by white (W) pixels without reducing the sensitivity obtained by the W pixels, when a color filter including the W pixels is in use.

BACKGROUND ART

In solid-state imaging devices such as charge coupled device (CCD) and complementary metal oxide semiconductor (CMOS) image sensors, pixels are gradually becoming smaller in size while the number of pixels is increasing to enhance the resolution performance. When the sizes of the pixels are reduced to some extent, the sensitivity characteristics per pixel decline, and obtaining the necessary sensitivity becomes difficult.

Accordingly, there is a known technique that increases the sensitivity by disposing pixels that pass light in the entire visible light region (hereinafter, referred to as a white (W) pixel) in addition to regular red (R), green (G), and blue (B) pixels (for example, refer to Patent Documents 1 and 2).

CITATION LIST

Patent Document

Patent Document 1: Japanese Patent Application Laid-Open No. 2009-26808
Patent Document 2: Japanese Patent Application Laid-Open No. 2009-81169

SUMMARY OF THE INVENTION

Problems to be Solved by the Invention

In general, the color mixture is more likely to occur in a solid-state imaging device including the W pixels than in a solid-state imaging device in a Bayer array. Since there is a plurality of light paths that cause the color mixture, it is not easy to consider one. However, as one of such possible paths, there is a path that allows light to penetrate into a color filter (which may also be referred to as a CF, hereinafter) of an R pixel, a G pixel, or a B pixel (which may also be referred to as RGB pixels, hereinafter) from a portion above an inter-pixel light shielding film in a CF of a W pixel.

Now, a stark difference between the solid-state imaging device including the W pixels and the solid-state imaging device in the Bayer array is that in the solid-state imaging device in the Bayer array, even when light that has passed through a CF is incident on a CF of a different color, little of the light passes through the CF of the different color because of greatly different spectral characteristics.

By contrast, since light that has passed through a CF of the W pixel includes all wavelength components, the light that has passed through the CF of the W pixel passes through any of the CFs of the RGB pixels with their respective spectral characteristics when the light is incident thereon.

As a result, the color mixture is more likely to occur in the solid-state imaging device including the W pixels, and this is one of the significant factors that deteriorate the image quality.

The present technology has been made in view of the foregoing. In particular, the present technology is to reduce the color mixture without lowering the sensitivity in the solid-state imaging device including the W pixels.

Solutions to Problems

A solid-state imaging device according to one aspect of the present technology includes a filter configured to extract and pass, pixel-by-pixel, white light that is incident light itself and light of a plurality of kinds of specific wavelengths, and an inter-pixel light shielding film configured to shield, pixel-by-pixel, light from an adjacent pixel in the filter, wherein the inter-pixel light shielding film in a pixel that passes the white light is thinner than the inter-pixel light shielding film in a pixel that passes light of another kind of specific wavelength.

The inter-pixel light shielding film in the pixel that passes the light of the other kind of specific wavelength may be thicker, as the wavelength is shorter.

The light of the plurality of kinds of specific wavelengths may include red light, green light, and blue light.

The inter-pixel light shielding film in a pixel for the red light may be thinner than the inter-pixel light shielding film in a pixel for the green light, and the inter-pixel light shielding film in the pixel for the green light may be thinner than the inter-pixel light shielding film in a pixel for the blue light.

The light of the plurality of kinds of specific wavelengths may include yellow light, magenta light, and cyan light.

The inter-pixel light shielding film in a pixel for the yellow light may be thinner than the inter-pixel light shielding film in a pixel for the magenta light, and the inter-pixel light shielding film in the pixel for the magenta light may be thinner than the inter-pixel light shielding film in a pixel for the cyan light.

The light of the plurality of kinds of specific wavelengths may include red light and green light.

The inter-pixel light shielding film in a pixel for the red light may be thinner than the inter-pixel light shielding film in a pixel for the green light.

The light of the plurality of kinds of specific wavelengths may include red light and blue light.

The inter-pixel light shielding film in a pixel for the red light may be thinner than the inter-pixel light shielding film in a pixel for the blue light.

The light of the plurality of kinds of specific wavelengths may include green light and blue light.

The inter-pixel light shielding film in a pixel for the green light may be thinner than the inter-pixel light shielding film in a pixel for the blue light.

The inter-pixel light shielding film disposed at a position adjacent to the pixel that passes the white light in a pixel that passes the light of the plurality of kinds of specific wavelengths and that is adjacent to the pixel that passes the white light may be thicker than the inter-pixel light shielding film at another position.

The inter-pixel light shielding film disposed at the position adjacent to the pixel that passes the white light in the pixel that passes the light of the plurality of kinds of specific wavelengths and that is adjacent to the pixel that passes the white light may be thinner, as light of specific wavelength passing therethrough has a longer wavelength.

A imaging apparatus according to one aspect of the present technology includes a filter configured to extract and pass, pixel-by-pixel, white light that is incident light itself and light of a plurality of kinds of specific wavelengths, and an inter-pixel light shielding film configured to shield, pixel-by-pixel, light from an adjacent pixel in the filter, wherein the inter-pixel light shielding film in a pixel that passes the white light is thinner than the inter-pixel light shielding film in a pixel that passes light of another kind of specific wavelength.

An electronic apparatus according to one aspect of the present technology includes a filter configured to extract and pass, pixel-by-pixel, white light that is incident light itself and light of a plurality of kinds of specific wavelengths, and an inter-pixel light shielding film configured to shield, pixel-by-pixel, light from an adjacent pixel in the filter, wherein the inter-pixel light shielding film in a pixel that passes the white light is thinner than the inter-pixel light shielding film in a pixel that passes light of another kind of specific wavelength.

According to one aspect of the present technology, a filter extracts and passes, pixel-by-pixel, white light that is incident light itself and light of a plurality of kinds of specific wavelengths, and an inter-pixel light shielding film shields, pixel-by-pixel, light from an adjacent pixel in the filter. The inter-pixel light shielding film in a pixel that passes the white light is thinner than the inter-pixel light shielding film in a pixel that passes light of another kind of specific wavelength.

Effects of the Invention

According to one aspect of the present technology, it is possible to reduce the color mixture without lowering the sensitivity in the solid-state imaging device including the W pixels.

MODE FOR CARRYING OUT THE INVENTION

<Mechanism of Causing Color Mixture>

Figure 1:
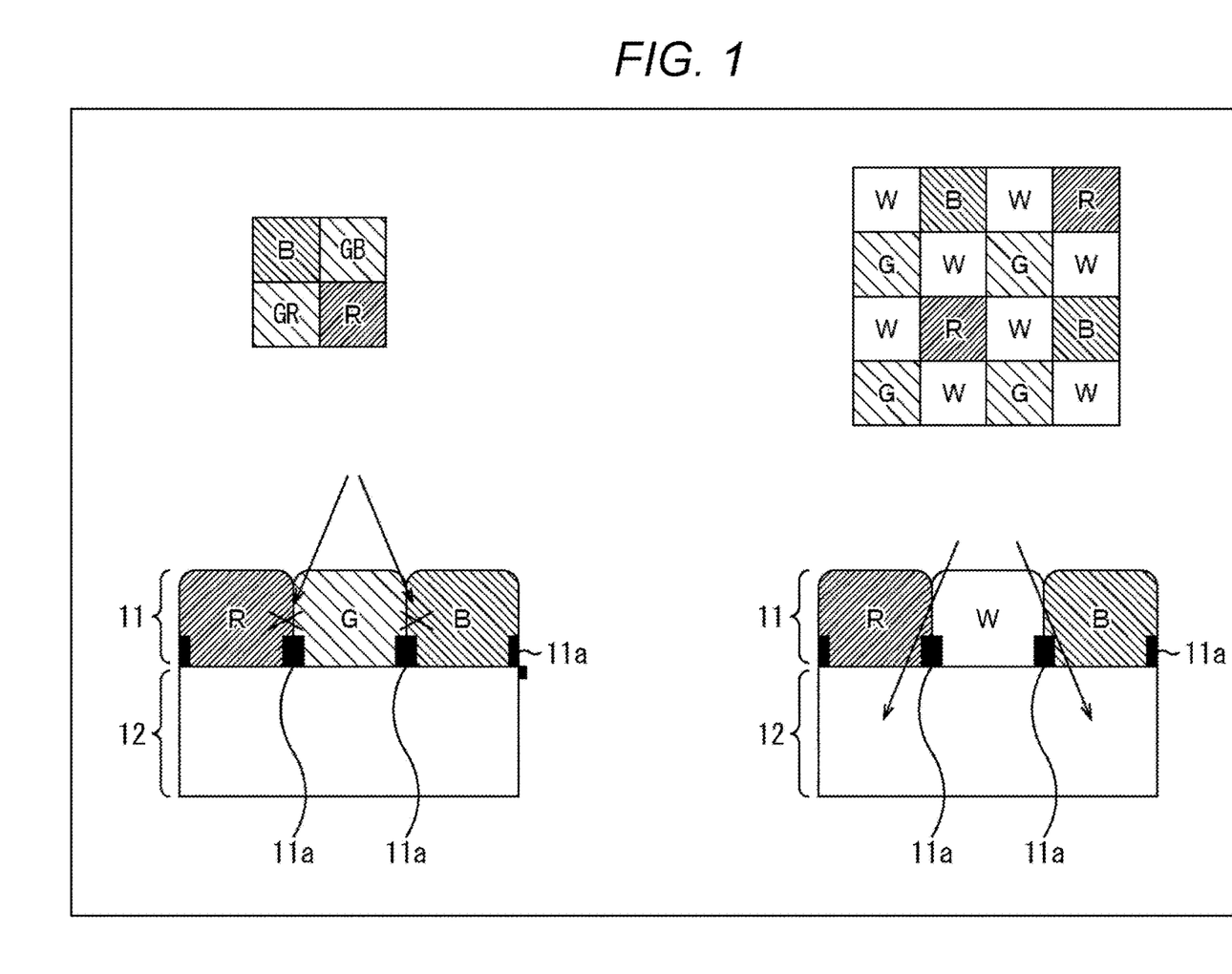
FIG. 1 is a diagram describing a mechanism of causing a color mixture.

The left part of FIG. 1 illustrates a structure of a solid-state imaging device including a color filter (which may also be referred to as a CF, hereinafter) in a Bayer array. The right part of FIG. 1 illustrates a structure of a solid-state imaging device including a CF in which W pixels are arranged in a checkered pattern, as a CF including the W pixels. Note that each of the left and right parts of FIG. 1 illustrates a color arrangement pattern of the CF in the top part, and a cross section of the side in the bottom part. Furthermore, in the color arrangement pattern of the CF in the top left part, the arranged colors denoted as GB and GR represent a G pixel that an adjacent pixel thereof in the horizontal direction is a B pixel and a G pixel that an adjacent pixel thereof in the horizontal direction is an R pixel, respectively. When there is no specific need to make a distinction therebetween, the GB and GR will be simply referred to as a G pixel.

In the solid-state imaging device, as illustrated in the left and right parts of FIG. 1, a color filter (CF) 11 and a light receiving section 12 are arranged in that order from the direction of incident light which is in the top part of the figure. In addition, as for the incident light, the CF 11 extracts and passes, pixel-by-pixel, light of a predetermined wavelength according to a corresponding arranged color. The light receiving section 12 outputs, pixel-by-pixel, a pixel signal according to the amount of the received light. The CF 11 includes, pixel-by-pixel, an inter-pixel light shielding film 11a disposed in part close to a portion contacting the CF 11. The inter-pixel light shielding film 11a shields light from a CF 11 of an adjacent pixel.

For the CF arranged in the Bayer array, as illustrated in the left part of FIG. 1, when the cross section of the side is considered with a green (G) pixel in the center thereof, for example, adjacent pixels are a red (R) pixel and a blue (B) pixel.

When considering the cross section of the side with the green (G) pixel in the center and an adjacent pixel thereof being the R pixel or the B pixel, there may be light that has passed through the inter-pixel light shielding film 11a. In such a case, the light that has passed through the inter-pixel light shielding film 11a between adjacent pixels, as indicated by arrows in the left part of FIG. 1, may be entered, but is not passed through due to the different spectral characteristics.

By contrast, in a case where white (W) pixels are included in the CF 11, which is, for example, arranged in the white checkered pattern as illustrated in the right part of FIG. 1, and when considering that a W pixel is in the center, a possible adjacent pixel is a red (R) pixel, a green (G) pixel, or a blue (B) pixel. Since the white light includes the light of all wavelengths, the light that has passed through the inter-pixel light shielding film 11a between adjacent pixels passes through the adjacent pixel, as indicated by arrows in the right part of FIG. 1. This results in inducing a color mixture. This is one of the mechanisms of main factors that cause the color mixture in the solid-state imaging device including the W pixels.

First Embodiment

Accordingly, in a solid-state imaging device including four types of pixels including W, R, G, and B pixels, the inter-pixel light shielding films in the RGB pixels are thicker than the inter-pixel light shielding films in the W pixels. In this way, it is possible to reduce the color mixture by shielding the incident light that enters the R, G, and B pixels from the W pixels, while suppressing the reduction in the sensitivity of the W pixels.

Note that hereinafter, a light shielding film between the W pixel and the R pixel will be referred to as a light shielding film 11r, a light shielding film between the W pixel and the B pixel will be referred to as a light shielding film 11b, and a light shielding film between the W pixel and the G pixel will be referred to as a light shielding film 11g, as indicated by a black bold line surrounding each pixel in FIG. 2.

Figure 2:
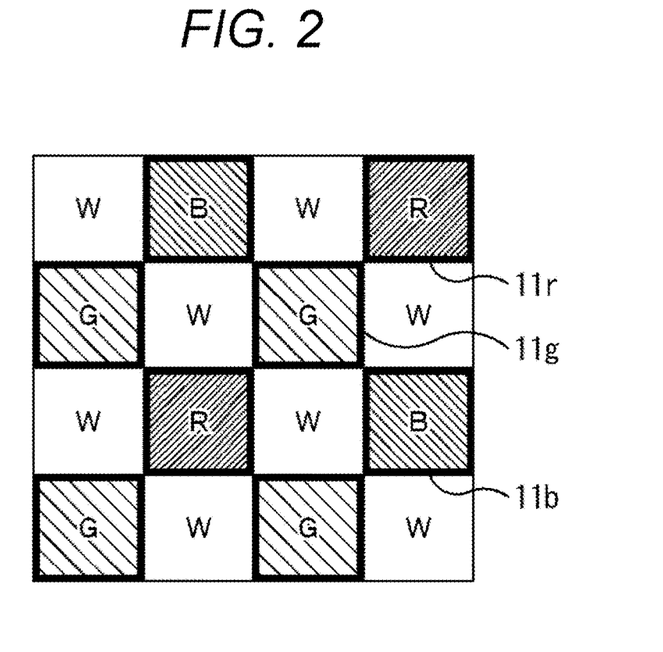
FIG. 2 is a diagram illustrating an exemplary configuration of a first embodiment of a color filter to which the present technology is applied.

More specifically, in FIG. 2, the centers in the thickness direction of the light shielding films 11r, 11g, and 11b are shifted toward the centers of the R, G, and B pixels, respectively. In such a configuration, when considering that the light shielding films are formed at positions adjacent to respective adjacent pixels of the W, R, G, and B pixels, the light shielding films in the W pixels are thinner than the light shielding films in the R, G, and B pixels. As a result, it is possible to shield the incident light entering the R, G, and B pixels from the W pixels without making the opening areas of the W pixels too small.

For each width of the light shielding films 11r, 11g, and 11b in FIG. 2, the color mixture from the W pixels and the effect of vignetting (a difference in brightness between the center portion and the surrounding portion of a pixel) caused by the light shielding films 11r, 11g, and 11b in the RGB pixels themselves need to be considered. In this case, each of the thicknesses of the light shielding films 11r, 11g, and 11b preferably corresponds to the light shielding film 11g which is adjacent to the G pixel having the highest sensitivity.

In addition, making the thicknesses of all the light shielding films 11r, 11g, and 11b thicker can reduce the color mixture from the W pixels, but results in lowering the sensitivity of the W pixels. An effect of providing the CF 11 including the W pixels is to increase the brightness and improve the sensitivity. However, making the inter-pixel light shielding films in the W pixel side too thick results in lowering the sensitivity. Therefore, a consideration also needs to be made for this point. For this reason, the center positions in the thickness direction of the light shielding films 11r, 11g, and 11b are shifted toward the respective center positions of the RGB pixels. Therefore, any of the light shielding films 11r, 11g, and 11b may also be configured such that the light shielding films 11r, 11g, and 11b are entirely within the R, G, and B pixels, respectively, and no light shielding films are within the W pixels. In this way, it is possible to suppress the color mixture while suppressing the reduction in the sensitivity of the W pixels.

Alternatively, heightening the light shielding films 11r, 11g, and 11b in the height direction may be another possible way. In this case, however, the characteristics of the incident angle deteriorate and the effect of vignetting increases. Therefore, a consideration also needs to be made for this point.

Second Embodiment

Described above is the example of suppressing the reduction in the sensitivity and occurrence of the color mixture by making the light shielding films in the W pixels thinner and making the light shielding films in the R, G, and B pixels thicker among the pixels adjacent to the W pixel. However, the thicknesses of the light shielding films in the R, G, and B pixels may be changed according to the wavelengths of colors of adjacent pixels.

Figure 3:
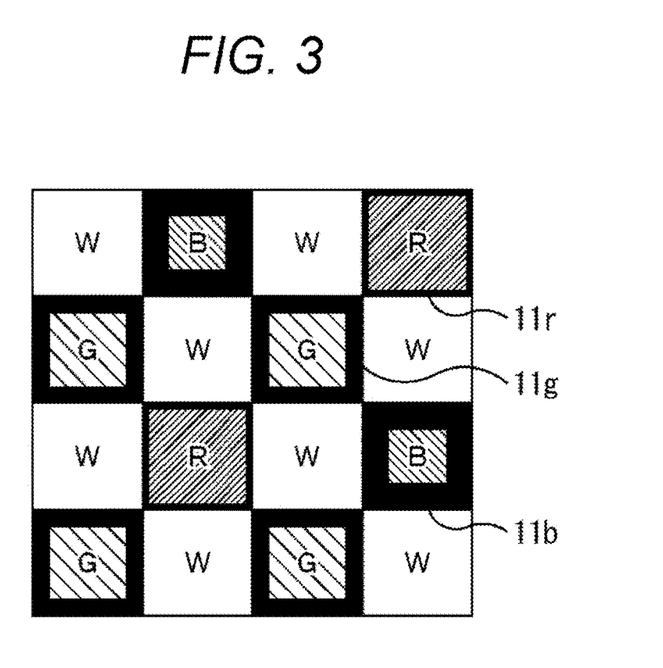
FIG. 3 is a diagram illustrating an exemplary configuration of a second embodiment of the color filter to which the present technology is applied.

FIG. 3 illustrates an exemplary configuration of the CF 11 in which the thicknesses of the light shielding films 11a are adjusted according to the wavelengths of the adjacent pixels, RGB pixels.

In general, the longer the wavelength is, the smaller the refractive index becomes, and the convergence of light is more difficult to attain. Accordingly, the probability of the occurrence of vignetting by the light shielding film 11a between adjacent pixels increases in order of colors having longer wavelengths (Red>Green>Blue). Therefore, by setting the thicknesses of the light shielding films 11r, 11g, and 11b to increase in order of 11r<11g<11b, the occurrence of the color mixture can be suppressed while the effect of vignetting is taken into consideration.

Note that as for the extent of the effect of vignetting, the influence of the structure of a device such as a distance between an on-chip lens (OCL) and the CF 11 and the curvature of the OCL also needs to be taken into consideration. However, the tendency is that the longer the wavelength, the greater the effect of vignetting. Therefore, depending on the device structure, the center position in the width direction of the inter-pixel light shielding film 11r between the W pixel and the R pixel may be at the midpoint between the center position of the W pixel and the center position of the R pixel, so that the thickness of the light shielding film becomes the same in both pixels.

Third Embodiment

Described above is the example of the CF 11 including the RGB pixels. However, the CF 11 may include other colors as long as the CF 11 includes the W pixel. For example, the CF 11 may include white, yellow, magenta, and cyan (WYMC) pixels.

Figure 4:
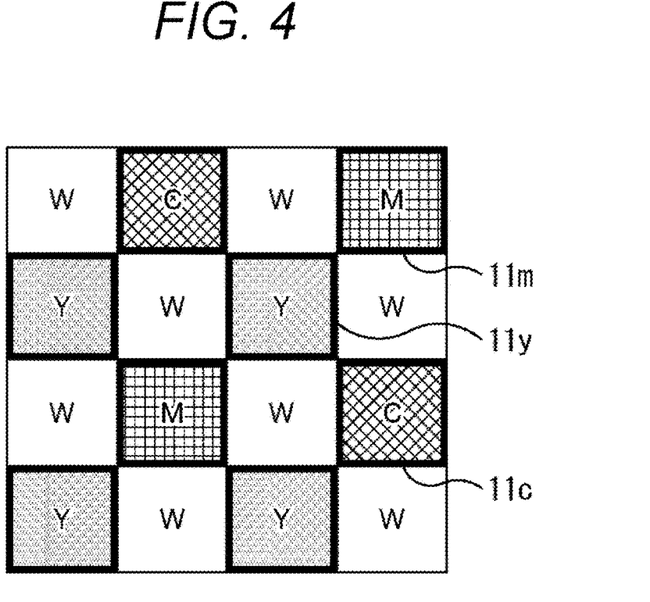
FIG. 4 is a diagram illustrating an exemplary configuration of a third embodiment of the color filter to which the present technology is applied.

FIG. 4 illustrates an example of the CF 11 including the WYMC pixels. As illustrated in FIG. 4, light shielding films 11y are disposed between the W pixels and the yellow (Y) pixels. Light shielding films 11m are disposed between the W pixels and the magenta (M) pixels. Light shielding films 11c are disposed between the W pixels and the cyan (C) pixels. More specifically, the center positions in the thickness direction of the light shielding films 11y, 11m, and 11c are shifted in the thickness direction toward the centers of the Y, M, and C pixels, respectively. In such a configuration, when considering that the light shielding films are formed at positions adjacent to respective adjacent pixels of the W, Y, M, and C pixels, the light shielding films in the W pixels are thinner than the light shielding films in the Y, M, and C pixels. Therefore, it is possible to shield the incident light entering the Y, M, and C pixels from the W pixels without making the opening areas of the W pixels too small. As a result, it is possible to suppress the occurrence of the color mixture while suppressing the reduction in the sensitivity of the W pixels.

Note that since the light shielding films 11y, 11m, and 11c are configured to shield the light from the W pixels incident on the YMC pixels, the effect of vignetting needs to be taken into consideration for the thicknesses of the light shielding films 11y, 11m, and 11c. In this case, it is preferred that the thicknesses of the light shielding films 11y, 11m, and 11c match the thickness of the light shielding film 11y in the Y pixel having the highest sensitivity.

Fourth Embodiment

In the CF 11 including the WYMC pixels as well, the thickness of each inter-pixel light shielding film may correspond to the wavelength.

Figure 5:
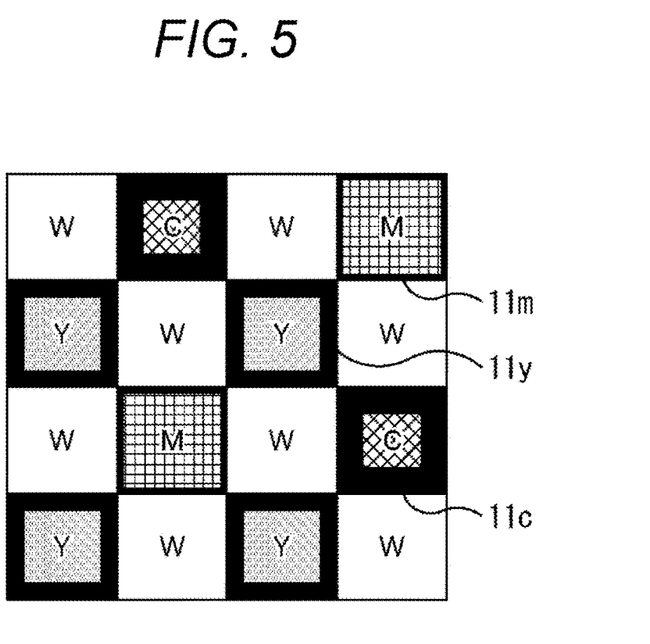
FIG. 5 is a diagram illustrating an exemplary configuration of a fourth embodiment of the color filter to which the present technology is applied.

FIG. 5 illustrates an example of the CF 11 including the WYMC pixels in which the thickness of each inter-pixel light shielding film corresponds to the wavelength.

More specifically, as described above, the longer the wavelength is, the smaller the refractive index becomes, and the convergence of light is more difficult to attain, in general. Therefore, the effect of vignetting by the inter-pixel light shielding films increases in order of Yellow including many long wavelength components (yellow light: mainly including red and green)>Magenta (magenta light: mainly including red and blue)>Cyan (cyan light: mainly including green and blue). Accordingly, the thicknesses are set in order of light shielding film 11y≤light shielding film 11m≤light shielding film 11c.

Note that as for the extent of the effect of vignetting, the effect also needs to be taken into consideration depending on a device structure such as a distance between an on-chip lens (OCL) and the CF and the curvature of the OCL. However, the tendency is that the longer the wavelength, the greater the effect of vignetting. Therefore, depending on the device structure, the center position in the width direction of the inter-pixel light shielding film 11y between the W pixel and the Y pixel may be at the midpoint between the center position of the W pixel and the center position of the Y pixel, so that the thickness becomes the same with respect to both pixels. Note that in this case, depending on the color arrangement pattern, in a case where the Y pixel and the M pixel are adjacent to each other, the thickness of the light shielding film 11ym (not illustrated) between the pixels may be the same therebetween, and in a case where the M pixel and the C pixel are adjacent to each other, the thickness of the light shielding film 11mc (not illustrated) between the pixels may be the same therebetween.

Fifth Embodiment

Described above is the configuration of the CF 11 with four colors of pixels including the WRGB pixels or the WYMC pixels. However, as long as the CF 11 includes the W pixel, another color arrangement pattern may be possible. For example, by setting the light shielding films in a similar manner, the CF 11 with three colors of pixels including WRG pixels also attains a similar effect.

Figure 6:
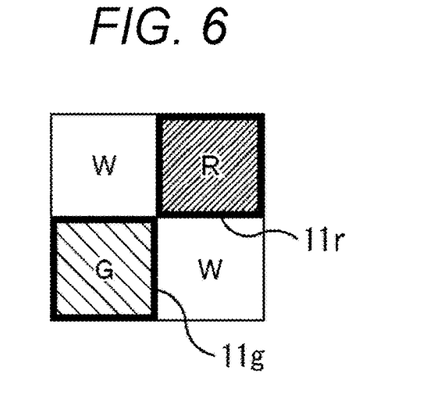
FIG. 6 is a diagram illustrating an exemplary configuration of a fifth embodiment of the color filter to which the present technology is applied.

FIG. 6 illustrates an example of the CF 11 with three colors of pixels including the WRG pixels.

More specifically, as illustrated in FIG. 6, the center positions in the thickness direction of the inter-pixel light shielding film 11r between the W pixel and the R pixel and the inter-pixel light shielding film 11g between the W pixel and the G pixel are shifted toward the center position of the R pixel and the center position of the G pixel, respectively. In this case as well, the color mixture from the W pixels and the effect of vignetting by the light shielding films 11r and 11g in their respective R and G pixels are taken into consideration for the widths of the light shielding films 11r and 11g. Furthermore, in this case as well, it is preferred that the thicknesses of the light shielding films 11r and 11g match the light shielding film 11g in the G pixel having a high sensitivity.

Sixth Embodiment

Described above is the example of the CF 11 with three colors of pixels including the WRG pixels, in which the thicknesses of both of the light shielding films 11r and 11g are the same. However, the thicknesses may correspond to the wavelengths of the colors of pixels adjacent to the W pixels.

Figure 7:
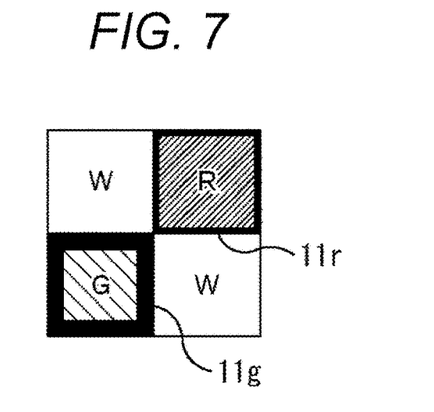
FIG. 7 is a diagram illustrating an exemplary configuration of a sixth embodiment of the color filter to which the present technology is applied.

FIG. 7 illustrates an example of the CF 11 with three colors of pixels including the WRG pixels, in which the thicknesses of the light shielding films 11r and 11g correspond to the wavelengths of the colors of the pixels adjacent to the W pixels.

More specifically, in general, the longer the wavelength is, the smaller the refractive index becomes, and the convergence of light is more difficult to attain. Accordingly, the effect of vignetting by the inter-pixel light shielding films 11r and 11g increases in order of longer wavelengths: Red>Green. Therefore, the thicknesses of the light shielding films 11r and 11g are set to increase in order of light shielding film 11r<light shielding film 11g. The longer the wavelength of a color of a pixel adjacent to a W pixel, the greater the extent of the effect of vignetting. Therefore, depending on the device structure, the center position in the thickness direction of the inter-pixel light shielding film 11r between the W pixel and the R pixel may be at the midpoint between the center position of the W pixel and the center position of the R pixel, so that the widths in the W pixel and the R pixel become the same.

Seventh Embodiment

Described above is the configuration of the CF 11 with three colors of pixels including the WRG pixels. However, as long as the CF 11 includes the W pixel, another color arrangement pattern may be possible. For example, by setting the light shielding films in a similar manner, a CF 11 with three colors of pixels including WRB pixels also attains a similar effect.

Figure 8:
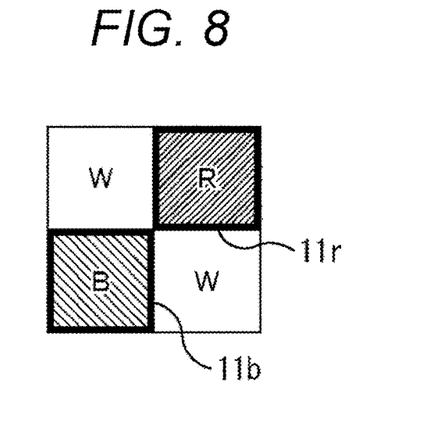
FIG. 8 is a diagram illustrating an exemplary configuration of a seventh embodiment of the color filter to which the present technology is applied.

FIG. 8 illustrates an example of the CF 11 with three colors of pixels including the WRB pixels.

More specifically, as illustrated in FIG. 8, the center positions in the thickness direction of the inter-pixel light shielding film 11r between the W pixel and the R pixel and the inter-pixel light shielding film 11b between the W pixel and the B pixel are shifted toward the center position of the R pixel and the center position of the B pixel, respectively. In this case as well, the color mixture from the W pixels and the effect of vignetting by the light shielding films 11r and 11b in their respective R and B pixels are taken into consideration for the widths of the light shielding films 11r and 11b. Furthermore, in this case as well, the thicknesses of the light shielding films 11r and 11g preferably match the light shielding film 11r in the R pixel having a high sensitivity.

Eighth Embodiment

Described above is the example of the CF 11 with three colors of pixels including the WRB pixels, in which the thicknesses of both of the light shielding films 11r and 11b are the same. However, the thicknesses may correspond to the wavelengths of the colors of pixels adjacent to the W pixels.

Figure 9:
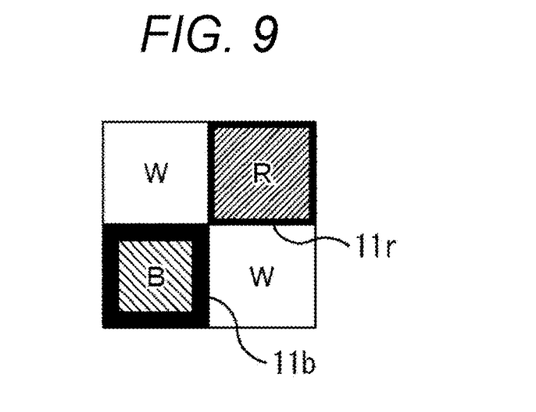
FIG. 9 is a diagram illustrating an exemplary configuration of an eighth embodiment of the color filter to which the present technology is applied.

FIG. 9 illustrates an example of the CF 11 with three colors of pixels including the WRB pixels, in which the thicknesses of the light shielding films 11r and 11b correspond to the wavelengths of the colors of the pixels adjacent to the W pixels.

More specifically, in general, the longer the wavelength is, the smaller the refractive index becomes, and the convergence of light is more difficult to attain. Accordingly, the effect of vignetting by the inter-pixel light shielding films 11r and 11b increases in order of longer wavelengths: Red>Blue. Therefore, the widths of the light shielding films 11r and 11b are set to increase in order of light shielding film 11r<light shielding film 11b. The longer the wavelength of a color of a pixel adjacent to a W pixel, the greater the extent of the effect of vignetting. Therefore, depending on the device structure, the center position in the thickness direction of the inter-pixel light shielding film 11r between the W pixel and the R pixel may be at the midpoint between the center position of the W pixel and the center position of the R pixel, so that the widths in the W pixel and the R pixel become the same.

Ninth Embodiment

Described above is the configuration of the CF 11 including three colors of pixels including the WRB. However, as long as the CF 11 includes the W pixel, another color arrangement pattern may be possible. For example, by setting the light shielding films in a similar manner, the CF 11 with three colors of pixels including WGB pixels also attains a similar effect.

Figure 10:
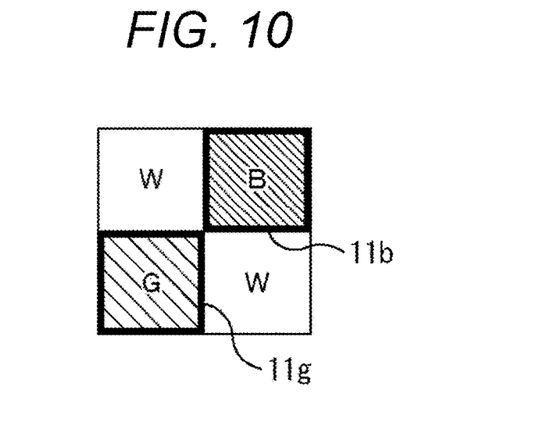
FIG. 10 is a diagram illustrating an exemplary configuration of a ninth embodiment of the color filter to which the present technology is applied.

FIG. 10 illustrates an example of the CF 11 with three colors of pixels including the WGB pixels.

More specifically, as illustrated in FIG. 10, the center positions in the thickness direction of the inter-pixel light shielding film 11g between the W pixel and the G pixel and the inter-pixel light shielding film 11b between the W pixel and the B pixel are shifted toward the center position of the G pixel and the center position of the B pixel, respectively.

In this case as well, the color mixture from the W pixels and the effect of vignetting by the light shielding films 11g and 11b in their respective G and B pixels are taken into consideration for the widths of the light shielding films 11g and 11b. Furthermore, in this case as well, it is preferred that the thicknesses of the light shielding films 11g and 11b match the light shielding film 11g in the G pixel having a high sensitivity.

Tenth Embodiment

Described above is the example of the CF 11 with three colors of pixels including the WGB pixels, in which the thicknesses of both of the light shielding films 11g and 11b are the same. However, the thicknesses may correspond to the wavelengths of the colors of pixels adjacent to the W pixels.

Figure 11:
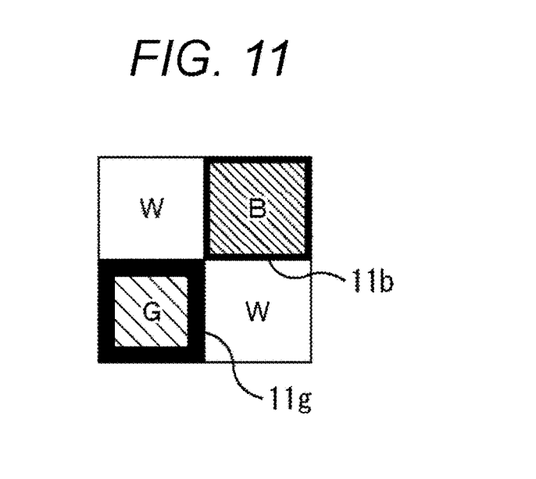
FIG. 11 is a diagram illustrating an exemplary configuration of a tenth embodiment of the color filter to which the present technology is applied.

FIG. 11 illustrates an example of the CF 11 with three colors of pixels including the WGB pixels, in which the thicknesses of the light shielding films 11g and 11b correspond to the wavelengths of the colors of the pixels adjacent to the W pixels.

More specifically, in general, the longer the wavelength is, the smaller the refractive index becomes, and the convergence of light is more difficult to attain. Accordingly, the effect of vignetting by the inter-pixel light shielding films 11g and 11b increases in order of longer wavelengths: Green>Blue. Therefore, the widths of the light shielding films 11g and 11b are set to increase in order of light shielding film 11b<light shielding film 11g. The longer the wavelength of a color of a pixel adjacent to a W pixel, the greater the extent of the effect of vignetting. Therefore, depending on the device structure, the center position in the thickness direction of the inter-pixel light shielding film 11g between the W pixel and the G pixel may be at the midpoint between the center position of the W pixel and the center position of the G pixel, so that the widths in the W pixel and the G pixel become the same.

Eleventh Embodiment

Described above is the example of disposing the light shielding films between any of the pixels. However, as long as only the light from the W pixels can be shielded from entering the RGB pixels or the YMC pixels, the light shielding films may be configured only between the pixels to which the W pixels are adjacent, according to the color arrangement pattern of the pixels.

Figure 12:
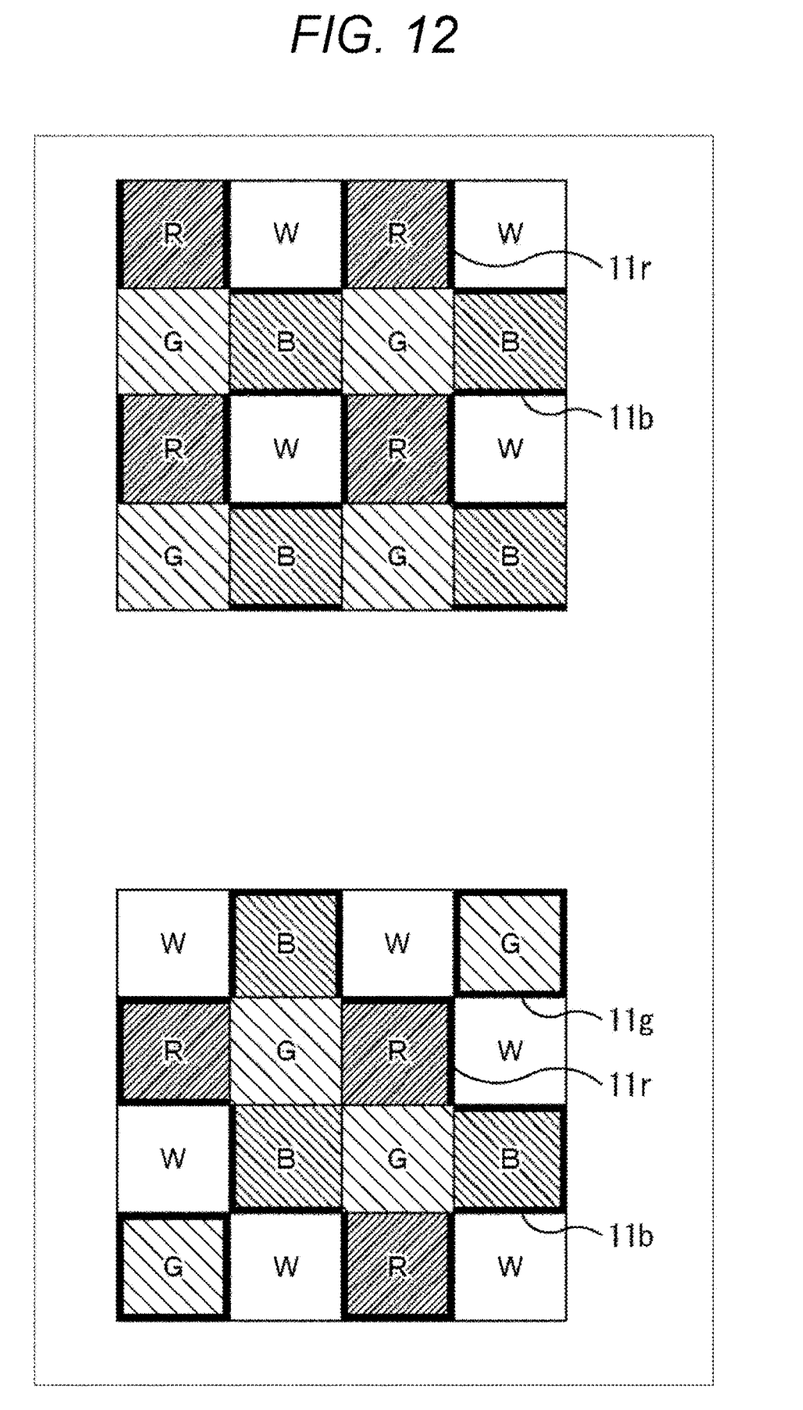
FIG. 12 is a diagram illustrating an exemplary configuration of an eleventh embodiment of the color filter to which the present technology is applied.

The top part of FIG. 12 illustrates an example of a pixel array in a unit of 4 pixels×4 pixels: the R pixel, the W pixel, the R pixel, the W pixel from the left in the uppermost row; the G pixel, the B pixel, the G pixel, the B pixel in the second row; the R pixel, the W pixel, the R pixel, the W pixel in the third row; the G pixel, the B pixel, the G pixel, the B pixel in the fourth row.

In the top part of FIG. 12, the light shielding films 11b are disposed between the W pixels and the B pixels. The light shielding films 11r are disposed between the W pixels and the R pixels. Light shielding films having the same degree as the W pixel side are disposed between the other pixels.

Furthermore, the bottom part of FIG. 12 illustrates an example of a pixel array in a unit of 4 pixels×4 pixels: the W pixel, the B pixel, the W pixel, the G pixel from the left in the uppermost row; the R pixel, the G pixel, the R pixel, the W pixel in the second row; the W pixel, the B pixel, the G pixel, the B pixel in the third row; the G pixel, the W pixel, the R pixel, the W pixel in the fourth row.

In the bottom part of FIG. 12 as well, the light shielding films 11b are disposed between the W pixels and the B pixels. The light shielding films 11r are disposed between the W pixels and the R pixels. The light shielding films 11g are disposed between the W pixels and the G pixels. Light shielding films having the same degree as the W pixel side are disposed between the other pixels.

Note that in case of the bottom part of FIG. 12, the inter-pixel light shielding widths may vary in the pixels having the same color, and the sensitivities may vary accordingly. In such a case, correction may be made by applying different gains among the same color. More specifically, as for the two R pixels in the second row of the bottom part of FIG. 12, regarding the R pixel on the left part, the light shielding films 11r are arranged on three of the four surrounding sides. By contrast, regarding the R pixel on the right part, the light shielding films 11r are arranged on the two sides. Accordingly, the two R pixels in the second row of the bottom part of FIG. 12 have different sensitivities. Therefore, correction may be made to such pixels by applying different gains thereto, so that the pixels are regarded and processed as having the same sensitivity.

In the top and bottom configurations of FIG. 12, the centers in the thickness direction of any of the light shielding films 11r, 11g, and 11b are each shifted toward the center of the corresponding pixel adjacent to and in the direction opposite to the W pixel of the corresponding pixel pair. In this way, in any of the configurations, it is possible to suppress the color mixture from the W pixels caused by the light incident on the adjacent RGB pixels, without lowering the sensitivity of the W pixel.

Twelfth Embodiment

Described above is the example of configuring the light shielding films only between the pixels to which the W pixels are adjacent, according to the color arrangement pattern of the pixels. However, the light shielding films may also be configured such that the thicknesses correspond to the wavelengths of the colors of pixels to which the W pixels are adjacent.

Figure 13:
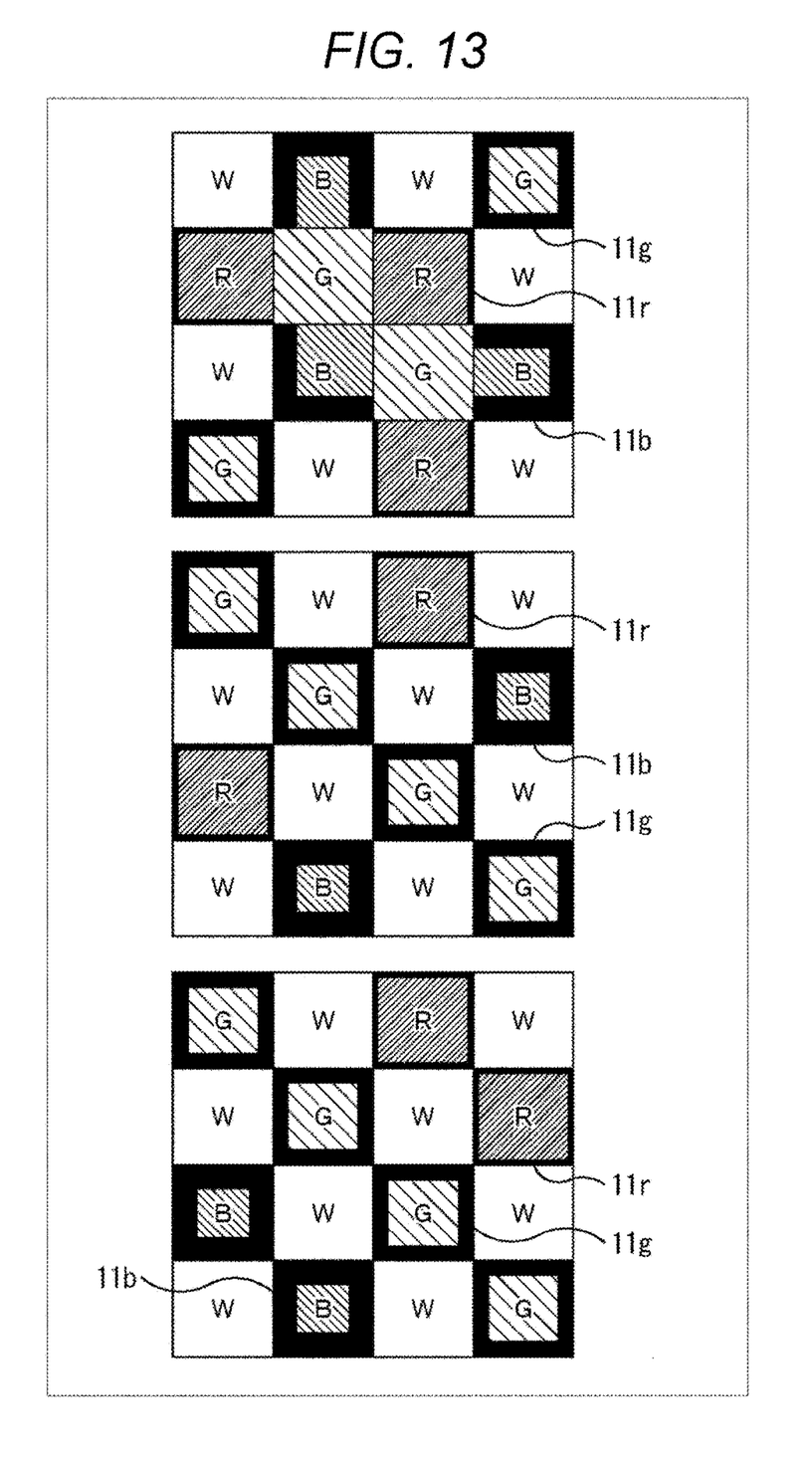
FIG. 13 is a diagram illustrating an exemplary configuration of a twelfth embodiment of the color filter to which the present technology is applied.

The top part of FIG. 13 illustrates an example of a pixel array in a unit of 4 pixels×4 pixels: the W pixel, the B pixel, the W pixel, the G pixel from the left in the uppermost row; the R pixel, the G pixel, the R pixel, the W pixel in the second row; the W pixel, the B pixel, the G pixel, the B pixel in the third row; the G pixel, the W pixel, the R pixel, the W pixel in the fourth row.

In addition, the middle part of FIG. 13 illustrates an example of a pixel array in a unit of 4 pixels×4 pixels: the G pixel, the W pixel, the R pixel, the W pixel from the left in the uppermost row; the W pixel, the G pixel, the W pixel, the B pixel in the second row; the R pixel, the W pixel, the G pixel, the W pixel in the third row; the W pixel, the B pixel, the W pixel, the G pixel in the fourth row.

Furthermore, the bottom part of FIG. 13 illustrates an example of a pixel array in a unit of 4 pixels×4 pixels: the G pixel, the W pixel, the R pixel, the W pixel from the left in the uppermost row; the W pixel, the G pixel, the W pixel, the R pixel in the second row; the B pixel, the W pixel, the G pixel, the W pixel in the third row; the W pixel, the B pixel, the W pixel, the G pixel in the fourth row.

In any of FIG. 13, the light shielding films 11b are disposed between the W pixels and the B pixels. The light shielding films 11r are disposed between the W pixels and the R pixels. The light shielding films 11g are disposed between the W pixels and the G pixels. Light shielding films having the same degree as the W pixel side are disposed between the other pixels.

Furthermore, the longer the wavelength is, the smaller the refractive index becomes, and the convergence of light is more difficult to attain and the effect of vignetting increases. Therefore, the thicknesses of the light shielding films 11r, 11g, and 11b are set in order of the light shielding film 11r<light shielding film 11g<light shielding film 11b. In this way, it is possible to reduce the influence of the color mixture from the W pixels while suppressing the lowering of the sensitivity of the brightness.

Note that in any cases of FIG. 13, the inter-pixel light shielding widths may vary in the pixels having the same color, and the sensitivities may vary accordingly. In such a case, correction may be made by applying different gains among the same color. More specifically, for example, as for the two B pixels in the third row of the top part of FIG. 13, regarding the B pixel on the left part, the light shielding films 11b are arranged on two of the four surrounding sides. By contrast, regarding the B pixel on the right part, the light shielding films 11b are arranged on the three sides. Accordingly, the two B pixels in the third row of the top part of FIG. 13 have different sensitivities. Therefore, correction may be made to such pixels by applying different gains thereto, so that the pixels are regarded and processed as having the same sensitivity.

In any cases, it is possible to reduce the influence of the color mixture from the W pixels while suppressing the lowering of the sensitivity of the brightness through the application of the above-described present technology.

Note that although the description above has been with regard to the W pixels, the same can be applied to a pixel, such as a Yellow pixel, having spectral characteristics similar to those of the W pixel, and a pixel having a relatively high degree of contribution mainly to a brightness signal.

<Example of Application to Electronic Apparatus>

The above-described solid-state imaging device can be applied to various electronic apparatuses such as an imaging apparatus including a digital still camera and a digital video camera, a mobile phone including imaging functions, or other devices including imaging functions, for example.

Figure 14:
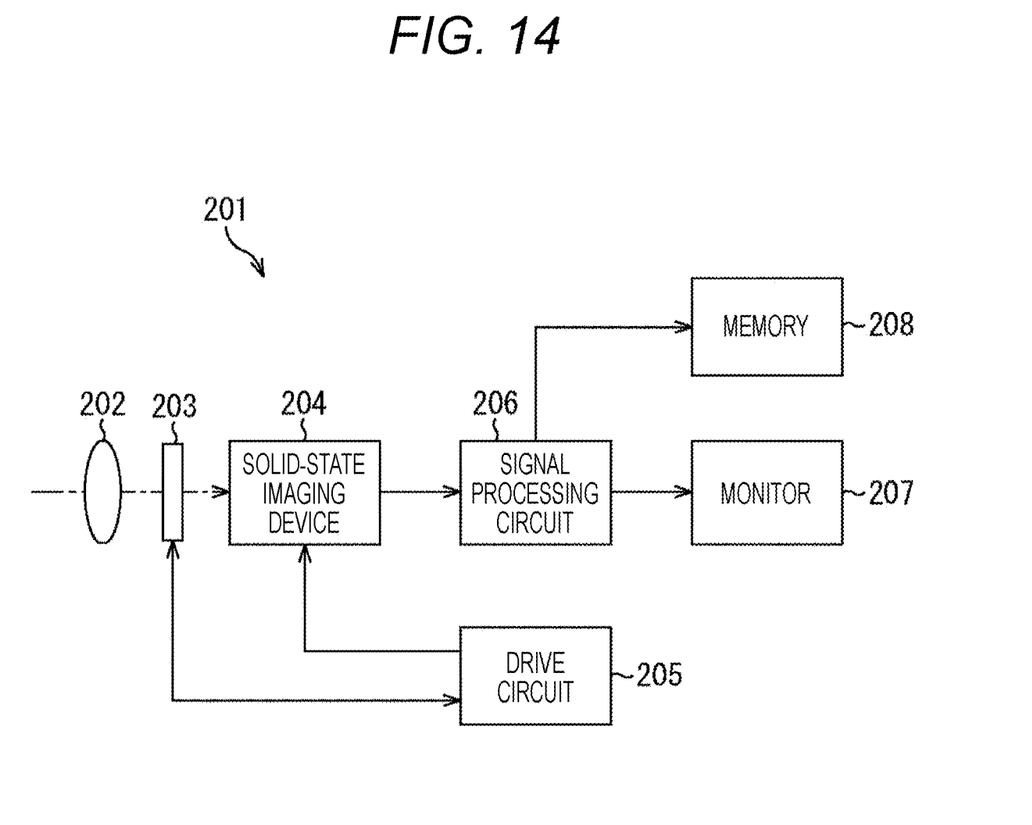
FIG. 14 is a diagram illustrating an exemplary configuration of an imaging apparatus serving as an electronic apparatus to which a solid-state imaging device according to the present technology is applied.

FIG. 14 is a block diagram illustrating an exemplary configuration of an imaging apparatus serving as an electronic apparatus to which the present technology is applied.

An imaging apparatus 201 illustrated in FIG. 14 includes an optical system 202, a shutter apparatus 203, a solid-state imaging device 204, a drive circuit 205, a signal processing circuit 206, a monitor 207, and a memory 208. The imaging apparatus 201 is capable of capturing a still image and a moving image.

The optical system 202 includes one or a plurality of lenses. The optical system 202 guides light (incident light) from an object to the solid-state imaging device 204, and forms an image on a light receiving surface of the solid-state imaging device 204.

The shutter apparatus 203 is disposed between the optical system 202 and the solid-state imaging device 204, and controls a light irradiation period and a light shielding period to the solid-state imaging device 204, according to the control of the drive circuit 205.

The solid-state imaging device 204 includes above-described solid-state imaging device 41. Signal charges are accumulated on the solid-state imaging device 204 for a certain period, according to the light by which the image is formed on the light receiving surface through the optical system 202 and the shutter apparatus 203. The signal charges accumulated on the solid-state imaging device 204 are transferred according to a drive signal (timing signal) supplied from the drive circuit 205. The solid-state imaging device 204 may be configured as a one chip by itself, or may be configured as part of a camera module packaged with the optical system 202, the signal processing circuit 206, or the like.

The drive circuit 205 outputs a drive signal of controlling the transfer operations of the solid-state imaging device 204 and the shutter operations of the shutter apparatus 203 to drive the solid-state imaging device 204 and the shutter apparatus 203.

The signal processing circuit 206 performs a variety of signal processing with respect to the signal charges output from the solid-state imaging device 204. The image (image data) obtained by the signal processing of the signal processing circuit 206 is supplied to the monitor 207 to be displayed, or is supplied to the memory 208 to be stored (recorded).

In the imaging apparatus 201 configured as described above, the image quality can be improved by applying the above-described solid-state imaging device, serving as the solid-state imaging device 204, which can suppress the occurrence of the color mixture while suppressing the lowering of the sensitivity.

Furthermore, the embodiments of the present invention are not limited to the above-described embodiments, and various modifications can be made without departing from the gist of the present invention.

Additionally, the present technology may also be configured as below.

(1) A solid-state imaging device, including:
a filter configured to extract and pass, pixel-by-pixel, white light that is incident light itself and light of a plurality of kinds of specific wavelengths; and
an inter-pixel light shielding film configured to shield, pixel-by-pixel, light from an adjacent pixel in the filter,
wherein the inter-pixel light shielding film in a pixel that passes the white light is thinner than the inter-pixel light shielding film in a pixel that passes light of another kind of specific wavelength.

(2) The solid-state imaging device according to (1),
wherein the inter-pixel light shielding film in the pixel that passes the light of the other kind of specific wavelength is thicker, as the wavelength is shorter.

(3) The solid-state imaging device according to (1) or (2),
wherein the light of the plurality of kinds of specific wavelengths includes red light, green light, and blue light.

(4) The solid-state imaging device according to (3),
wherein the inter-pixel light shielding film in a pixel for the red light is thinner than the inter-pixel light shielding film in a pixel for the green light, and the inter-pixel light shielding film in the pixel for the green light is thinner than the inter-pixel light shielding film in a pixel for the blue light.

(5) The solid-state imaging device according to any one of (1) to (4),
wherein the light of the plurality of kinds of specific wavelengths includes yellow light, magenta light, and cyan light.

(6) The solid-state imaging device according to (5),
wherein the inter-pixel light shielding film in a pixel for the yellow light is thinner than the inter-pixel light shielding film in a pixel for the magenta light, and the inter-pixel light shielding film in the pixel for the magenta light is thinner than the inter-pixel light shielding film in a pixel for the cyan light.

(7) The solid-state imaging device according to any one of (1) to (6),
wherein the light of the plurality of kinds of specific wavelengths includes red light and green light.

(8) The solid-state imaging device according to (7),
wherein the inter-pixel light shielding film in a pixel for the red light is thinner than the inter-pixel light shielding film in a pixel for the green light.

(9) The solid-state imaging device according to any one of (1) to (8),
wherein the light of the plurality of kinds of specific wavelengths includes red light and blue light.

(10) The solid-state imaging device according to (9),
wherein the inter-pixel light shielding film in a pixel for the red light is thinner than the inter-pixel light shielding film in a pixel for the blue light.

(11) The solid-state imaging device according to any one of (1) to (10),
wherein the light of the plurality of kinds of specific wavelengths includes green light and blue light.

(12) The solid-state imaging device according to (11),
wherein the inter-pixel light shielding film in a pixel for the green light is thinner than the inter-pixel light shielding film in a pixel for the blue light.

(13) The solid-state imaging device according to any one of (1) to (12),
wherein the inter-pixel light shielding film disposed at a position adjacent to the pixel that passes the white light in a pixel that passes the light of the plurality of kinds of specific wavelengths and that is adjacent to the pixel that passes the white light is thicker than the inter-pixel light shielding film at another position.

(14) The solid-state imaging device according to (13),
wherein the inter-pixel light shielding film disposed at the position adjacent to the pixel that passes the white light in the pixel that passes the light of the plurality of kinds of specific wavelengths and that is adjacent to the pixel that passes the white light is thinner, as light of specific wavelength passing therethrough has a longer wavelength.

(15) An imaging apparatus, including:
a filter configured to extract and pass, pixel-by-pixel, white light that is incident light itself and light of a plurality of kinds of specific wavelengths; and
an inter-pixel light shielding film configured to shield, pixel-by-pixel, light from an adjacent pixel in the filter,
wherein the inter-pixel light shielding film in a pixel that passes the white light is thinner than the inter-pixel light shielding film in a pixel that passes light of another kind of specific wavelength.

(16) An electronic apparatus, including:
a filter configured to extract and pass, pixel-by-pixel, white light that is incident light itself and light of a plurality of kinds of specific wavelengths; and
an inter-pixel light shielding film configured to shield, pixel-by-pixel, light from an adjacent pixel in the filter,
wherein the inter-pixel light shielding film in a pixel that passes the white light is thinner than the inter-pixel light shielding film in a pixel that passes light of another kind of specific wavelength.

REFERENCE SIGNS LIST

11 Color filter (CF)
11a, 11r, 11g, 11b, 11y, 11m, 11c Light shielding film
13 Light receiving section

The invention claimed is:

1. A light detecting device comprising:
a plurality of pixels including:
a first pixel including a first color filter configured to transmit light of a first wavelength range; and
a second pixel including a second color filter configured to transmit light of a second wavelength range, the second color filter being surrounded by a first light shielding film in a plan view,
wherein the first wavelength range is different from the second wavelength range, and
wherein an effective light-receiving area of the first pixel is greater than an effective light-receiving area of the second pixel in the plan view.

2. The light detecting device according to claim 1, wherein the light of the first wavelength range is white light.

3. The light detecting device according to claim 2, wherein the light of the second wavelength range is at least one of red light, green light and blue light.

4. The light detecting device according to claim 2, wherein the light of the second wavelength range is at least one of yellow light, magenta light and cyan light.

5. The light detecting device according to claim 3, wherein the plurality of pixels further includes a third pixel including a third color filter configured to transmit light of a third wavelength range, the third color filter being surrounded by a second light shielding film in the plan view.

6. The light detecting device according to claim 5, wherein the plurality of pixels further includes a fourth pixel including a fourth color filter configured to transmit light of a fourth wavelength range, the fourth color filter being surrounded by a third light shielding film in the plan view.

7. The light detecting device according to claim 6, wherein the plurality of pixels further includes a fifth pixel including a fifth color filter configured to transmit light of a fifth wavelength range, the fifth color filter being surrounded by a fourth light shielding film in the plan view.

8. The light detecting device according to claim 7, wherein the first pixel is surrounded by the second pixel and the third pixel and the fourth pixel and the fifth pixel in the plan view.

9. The light detecting device according to claim 8, wherein the effective light-receiving area of the first pixel is an area surrounded by the first light shielding film and the second light shielding film and the third light shielding film and the fourth light shielding film in the plan view.

10. The light detecting device according to claim 9, wherein the light of the second wavelength range is red light, and the light of the third and fifth wavelength range is green light, and the light of the fourth wavelength range is blue light.

11. The light detecting device according to claim 10, wherein the effective light-receiving area of the first pixel is greater than an effective light-receiving area of the third pixel in the plan view, and the effective light-receiving area of the first pixel is greater than an effective light-receiving area of the fourth pixel in the plan view.

12. The light detecting device according to claim 11, wherein the effective light-receiving area of the second pixel is greater than the effective light-receiving area of the third pixel.

13. A light detecting device comprising:
a plurality of pixels including:
a first pixel including a first color filter configured to transmit light of a first wavelength range;
a second pixel including a second color filter configured to transmit light of a second wavelength range; and
a first light shielding film,
wherein the first wavelength range is different from the second wavelength range, and
wherein a center position of the first shielding film in a thickness direction is shifted from a boundary between the first color filter and the second color filter toward a center position of the second pixel.

14. The light detecting device according to claim 13, wherein the light of the first wavelength range is at least one of red light, green light, blue light and white light.

15. The light detecting device according to claim 13, wherein the light of the second wavelength range is at least one of red light, green light, blue light and white light.

16. The light detecting device according to claim 13, wherein a first edge of the light shielding film is attached to a portion of the first color filter, and a second edge of the light shielding film is attached to a portion of the second color filter.

17. The light detecting device according to claim 16, wherein the first color filter is adjacent to the second color filter.

18. The light detecting device according to claim 13, wherein the first light shielding film is disposed above a light receiving section.

19. The light detecting device according to claim 18, wherein the light receiving section outputs a pixel signal according to an amount of light.

20. An electronic apparatus comprising:
an optical system;
a signal processing circuit, and
a light detecting device comprising:
a plurality of pixels including:
a first pixel including a first color filter configured to transmit light of a first wavelength range;
a second pixel including a second color filter configured to transmit light of a second wavelength range; and
a first light shielding film,
wherein the first wavelength range is different from the second wavelength range, and
wherein a center position of the first shielding film in a thickness direction is shifted from a boundary between the first color filter and the second color filter toward a center position of the second pixel.

* * * * *